United States Patent [19]

Bellavance

[11] Patent Number: 5,023,482
[45] Date of Patent: Jun. 11, 1991

[54] ISL TO TTL TRANSLATOR

[75] Inventor: Joseph T. Bellavance, San Jose, Calif.

[73] Assignee: North American Philips Corp., Sunnyvale, Calif.

[21] Appl. No.: 733,416

[22] Filed: May 13, 1985

Related U.S. Application Data

[63] Continuation of Ser. No. 362,923, Mar. 29, 1982, abandoned.

[51] Int. Cl.[5] .................. H03K 19/091; H01L 27/082
[52] U.S. Cl. ..................................... 307/456; 307/458; 357/15; 357/44; 357/46; 357/92
[58] Field of Search .............. 307/456, 458, 475; 357/15, 44, 46, 92

[56] References Cited

U.S. PATENT DOCUMENTS

| | | | |
|---|---|---|---|
| 4,110,634 | 8/1978 | Tokumaru | 357/92 |
| 4,322,640 | 3/1982 | Fukushima et al. | 307/456 |
| 4,328,509 | 5/1982 | Lehning | 357/44 |
| 4,330,723 | 5/1982 | Griffith | 307/458 |
| 4,339,676 | 7/1982 | Ramsey | 307/458 |

FOREIGN PATENT DOCUMENTS

| | | |
|---|---|---|
| 9083 | 4/1980 | European Pat. Off. . |
| 3024273 | 2/1981 | Fed. Rep. of Germany . |
| 53-57723 | 5/1978 | Japan ..................................... 357/92 |
| 54-38779 | 3/1979 | Japan . |
| 2015840 | 9/1979 | United Kingdom . |

OTHER PUBLICATIONS

Lohstroh, IEEE J. of Solid State Circuits, vol. SC 14, No. 3, Jun. 1979, pp. 585–590.

*Primary Examiner*—William D. Larkins
*Attorney, Agent, or Firm*—A. Tamoshunas; R. Meetin

[57] ABSTRACT

An ISL clamped NPN transistor and a PNP interface transistor are merged together in a single semiconductive isolation island. The two transistors are laterally separated from each other along a semiconductive surface of the island, which also includes one or more metallic elements forming individual Schottky barrier contact diodes with the semiconductive surface. The PNP transistor provides translation between an ISL logic gate and a TTL logic gate. One of the Schottky diodes may be used in combination with the NPN transistor as an active pulldown for an output transistor of the TTL logic gate.

4 Claims, 4 Drawing Sheets

ISL TO TTL TRANSLATOR

This is a continuation of U.S. Pat. application, Ser. No. 362,923, filed Mar. 29, 1982, now abandoned.

BACKGROUND OF THE INVENTION

This invention relates to an ISL to TTL translator. It relates particularly to a compact integrated circuit arranged within a single isolation region that will translate from an ISL signal level to a TTL signal level without loading the ISL transistor.

Integrated Schottky logic (ISL) is a relatively new form of logic useful in large scale integrated circuits. ISL was first described in IEEE Journal of Solid State Circuits, Volume SC-14, No. 3, June 1979 in a paper authored by Jan Lohstroh, entitled, "ISL, a Fast and Dense Lower Power Logic, Made in a Standard Schottky Process". ISL provides a good compromise between low power Schottky TTL (LSTTL) and integrated injection logic ($I^2L$). It satisfies a demand for a circuit that consumes less power and takes up less chip area than LSTTL and requires a faster speed than $I^2L$.

An ISL gate in its simplest form comprises a current source, a normally operated collector down NPN transistor with a merged PNP clamp, and one or more output Schottky diodes. The PNP clamp, which may consist of the combination of a lateral PNP and a vertical PNP transistor sharing the collector and base regions of the NPN transistor, operates to prevent the NPN transistor from going too deeply into saturation, thereby reducing the saturation delay.

Although the IEEE article referred to above states that it is possible to combine ISL with other forms of logic, such as ECL, $I^2L$, and TTL on the same chip, it does not describe any way of translating between ISL and TTL. The obvious way to translate between an ISL gate and a TTL gate is to simply add two additional ISL gates between the input ISL gate and the TTL gate. However, the two additional ISL gates, each in its own isolation island, occupies too much space and undesirably introduces additional time delay.

Interface circuits are well known for forms of logic other than ISL. In Japanese Kokai No. 53-57723, an interface circuit uses a PNP level shift transistor coupled to the output of the NPN $I^2L$ transistor. However, that circuit merely accomplishes level shifting, and being applicable to $I^2L$ rather than ISL, does not provide other advantages that are uniquely associated with ISL. Furthermore there is no disclosure of merging the two transistors in a single isolation island or tub.

British Patent application GB 2.015.840A also discloses an $I^2L$ to TTL translator which accomplishes level translation, but here again has only the advantages associated with $I^2L$ rather than ISL. Also, there is no disclosure of merging transistors in a single isolation tub.

European Patent application 0009083 discloses a CML to TTL interface circuit, and German Patent application 3.024.273 discloses an ECL to TTL interface circuit. Neither of those references discloses merging transistors in a single isolation tub, and furthermore both references require two power supplies.

SUMMARY OF THE INVENTION

According to an aspect of the invention, an ISL clamped NPN transistor and a PNP interface transistor are merged together in a single semiconductive isolation island. The two transistors are laterally separated from each other along a semiconductive surface of the island, and within the island there is at least one metallic element forming a Schottky barrier contact with the semiconductive surface.

When the PNP transistor is coupled to TTL circuitry, which is present in a separate isolation island, the diode forming the Schottky barrier contact may be used advantageously in combination with the NPN transistor to provide an active pulldown function for one of the output transistors of the TTL circuit. The advantages of this active pulldown function are a reduction in the number of components, increased speed, and higher output breakdown voltage. These advantages will be discussed more fully in the specific description of the preferred embodiments.

DESCRIPTION OF THE PREFERRED EMBODIMENTS

Figure 1:
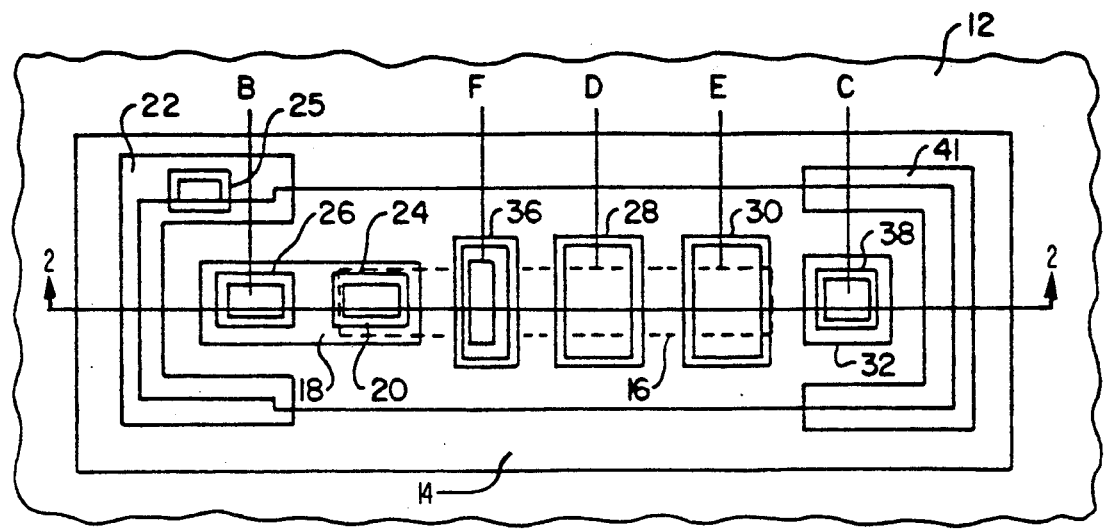
FIG. 1 is a plan view of an integrated circuit layout showing the ISL to TTL translator according to the invention.
Figure 2:
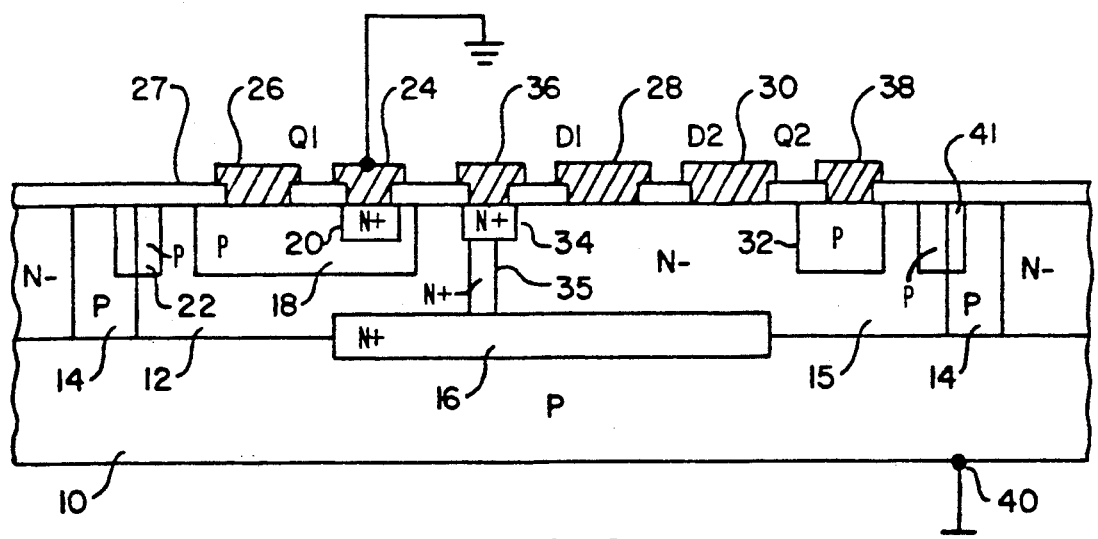
FIG. 2 is a sectional view taken along line 2—2 of FIG. 1.

Reference is now made to FIGS. 1 and 2 which show a greatly enlarged portion of an integrated circuit incorporating the ISL to TTL translator according to the invention. A p-type substrate 10, such as silicon, is provided with an n-type epitaxial layer 12. A peripheral isolation means 14 laterally surrounds a portion of the epitaxial layer 12 and extends in depth to the substrate 10. Within the confines of the isolation means 14 there is formed a single isolation island or tub 15 that contains the ISL to TTL translation circuit. The isolation means 14 may be produced by forming a p-type diffusion within the epitaxial layer 12 (as particularly shown in FIG. 2), thereby surrounding the isolation island 15 with a pn semiconductive junction. Alternatively, the isolation means 14 may be constituted by a dielectric material such as silicon dioxide that is formed by local oxidation of the n-type silicon epitaxial layer 12, which is the process known by the acronym LOCOS. Other dielectric material, such as silicon nitride, may also be used for the isolation means 14.

A heavily doped n-type buried layer 16 is provided at the interface of the substrate 10 and epitaxial layer 12 where a pn junction is formed. The buried layer 16 stops considerably short of the isolation means 14 on all four sides thereof, and extends in depth partly into the epitaxial layer 12 and partly into the substrate 10. The buried layer 16 may be produced by conventional processing means, as by implanting an n-type dopant into the substrate 10 prior to epitaxial deposition of the layer 12, after which, during formation of the epitaxial layer 12, the n-type dopant will diffuse vertically upward into the epitaxial layer 12 and vertically downward into the substrate 10.

An NPN ISL transistor Q1 is provided at one extreme end of the isolation island 15 and a PNP translation transistor Q2 is provided at the other end of the isolation island 15. The ISL transistor Q1 is formed by a p-type base region 18 formed in the epitaxial layer 12, which functions as the collector, and a heavily doped n-type emitter region 20 formed in the base region 18.

In a structure wherein the isolation region 14 is produced by a p-type region to form PN junction isolation, a p-type region 22 surrounds the base region 18 on three sides thereof in the form of a U-shaped collar. The p-type collar region 22 is spaced close to the base region 18 and merges with the isolation region 14. The emitter region 20 is offset from the center of the base region 18 in a direction away from the p-type collar region 22. Metallic ohmic contacts 24, 25, and 26 extending through openings in a silicon dioxide layer 27 are provided on the surfaces of the emitter region 20, collar region 22, and base region 18, respectively.

The buried layer 16 lies under the emitter region 20 but does not underlie the portion of the base region 18 that is free of the emitter region 20. The end of the buried layer 16 lies approximately beneath the center of the base region 18, so that the part of the epitaxial collector region 12 and the part of the substrate 10 underlying the p-type collar region 22 and also underlying approximately one half of the base region 18 are free of the buried layer 16.

While the NPN transistor Q1 has emitter, base, and collector regions 20, 18, and 12 respectively, it is shunted by a two part PNP clamping transistor having a vertical part and a lateral part. The vertical part of the PNP clamping transistor has region 18 as the emitter, epitaxial region 12 as the base, and the substrate 10 as the collector. The lateral part of the PNP clamping transistor has the region 18 as the emitter, epitaxial region 12 as the base, and the p-type collar region 22 as the collector. The p-type collar region 22 enchances the effect of the parasitic lateral PNP transistor already present in a junction isolated structure by decreasing the base width, thereby increasing the beta with attendant increase in switching speed of the ISL transistor Q1.

The two part PNP clamping transistor limits the extent to which the NPN transistor Q1 goes into deep saturation and thereby reduces the saturation delay. A more detailed discussion of this effect and the advantages of the ISL logic form is found in the Lohstroh paper referred to above.

In a structure wherein the isolation region 14 comprises a dielectric material, the p-type collar region 22 is omitted. In that case, the PNP clamping transistor comprises only the vertical part, and there is no lateral part present. Alternatively, with dielectric isolation, clamping action for the NPN transistor Q1 may be provided by a merged inversely operated NPN clamping transistor. Such a structure is described in the Lohstroh article referred to above. Accordingly, the term "ISL clamped NPN transistor" is intended to be generic to all of the aforementioned ways of clamping the NPN transistor Q1, whether they incorporate dielectric isolation or junction isolation, and whether they employ a single clamp or dual clamp of the PNP type or NPN type.

The remainder of the ISL structure comprises one or more Schottky junction diodes D1 and D2 formed with the collector region of the ISL transistor Q1, which in this case, is the epitaxial layer 12. The Schottky diodes D1 and D2 lie centrally within the isolation island 15 directly above the buried layer 16. The Schottky diodes are constituted by two metallic contacts 28 and 30 provided on the surface of the epitaxial layer 12 and are each made of such metal as to form a Schottky barrier junction with the n-type epitaxial material. A suitable metal for the Schottky contacts is a platinum-nickel alloy containing 60% platinum and 40% nickel, with a Schottky barrier height of about 0.78 eV.

At the opposite end of the isolation island 15 from the ISL transistor Q1 there is located the PNP translation transistor Q2. The emitter of the PNP transistor Q2 is constituted by a p-type region 32 formed in the epitaxial layer 12 over a region of the epitaxial layer-to-substrate junction that is free of the buried layer 16. The base of the PNP transistor Q2 is constituted by the epitaxial layer 12. To provide a base contact region for the PNP transistor Q2 and a collector contact region for the NPN transistor Q1, a heavily doped n-type region 34 is formed in the epitaxial layer 12 directly over the buried layer 16. A heavily doped n-type plug 35 connects the contact region 34 with the buried layer 16 through a low resistance path. The collector of the PNP transistor Q2 is formed by the substrate 10. Thus, the PNP transistor Q2 is vertically arranged within the isolation island 15. An ohmic metallic contact 36 is provided on the surface of the base contact region 34, and another ohmic metallic contact 38 is provided on the surface of the emitter region 32. The substrate 10 has a ground connection 40.

In a structure having junction isolation, the p-type emitter region 32 may be surrounded on three sides thereof by a p-type collar region 41 to enhance the parasitic lateral PNP transistor that appears in shunt with the PNP translation transistor Q2. The parasitic transistor has the p-type region 32 as emitter, the epitaxial layer 12 as base, and the isolation region 14 as collector. The p-type collar region 41 will narrow the base width of the parasitic lateral transistor, thereby increasing the beta with attendant increase in switching speed of the translation transistor Q2.

The impurity doping concentrations for an exemplary structure are such as to provide the following resistivities: 2 ohm-centimeters for the substrate 10, 0.3 ohm-centimeter for the epitaxial layer 12, 200 ohms per square for the base diffusion (regions 18, 32, 22, 41), and 2 ohms per square for the emitter and N+ diffusion (regions 20, 34, 35).

Figure 3:
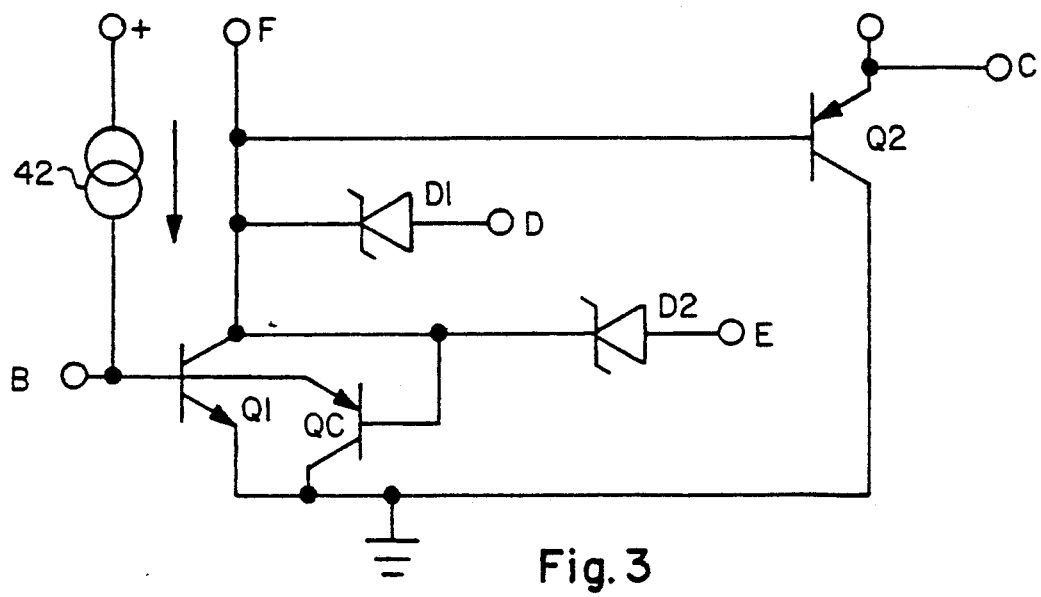
FIG. 3 is an equivalent circuit representation of the ISL to TTL translator of FIGS. 1 and 2.

An equivalent circuit diagram of the ISL to TTL translator structure is shown in FIG. 3. In FIG. 3 the ISL transistor Q1 is shown to consist of an NPN transistor having a PNP clamping transistor QC sharing common electrodes therewith, the PNP clamping transistor QC having both the lateral and the vertical components, or only a single component, as discussed above. An input terminal B is shown connected to the base of transistor Q1. Also shown connected to the base of transistor Q1 is a current source 42, which may be either a PNP transistor or a resistor coupled to a positive voltage supply. The current source 42 can be located in a separate isolation island.

An output terminal F is shown at the collector of transistor Q1. Two of the collector outputs are coupled through the two Schottky diodes D1 and D2 to output terminals D and E respectively, and a third collector output is coupled to the input base of the PNP translation transistor Q2. The emitter of the PNP transistor Q2 has an output at a terminal C.

Figure 4:
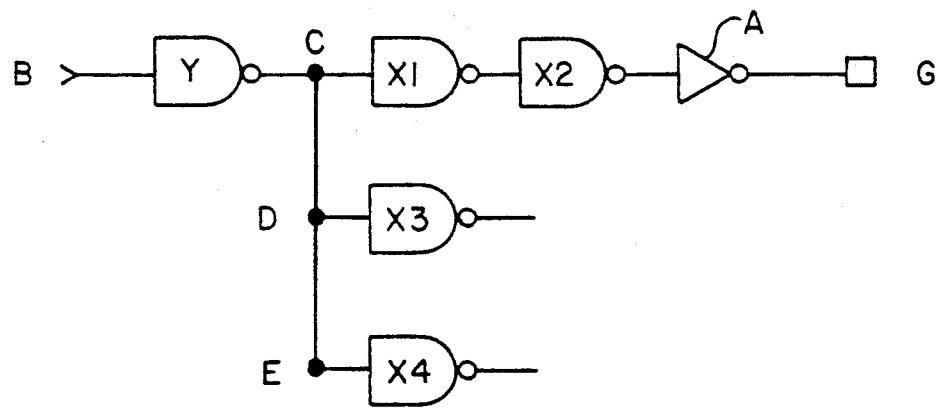
FIG. 4 is a logic diagram showing translation between ISL and TTL circuitry according to the prior art.

A logic diagram of a prior art circuit incorporating ISL input and TTL output is shown in FIG. 4. An input at terminal B is fed to a conventional ISL gate Y having three outputs at terminals C, D, and E. A signal at output terminal D is fed to an ISL gate X3 and a signal at output terminal E is fed to an ISL gate X4. At output terminal C it is desired to translate to a TTL output terminal G. Accordingly, it is necessary to provide two more ISL gates X1 and X2 before the signal can be applied to a TTL inverter A and obtain an output at terminal G. If gate Y is to perform a logic function at the same time that the ouptut buffer A is being driven, then gates X1 and X2 are necessary as buffers to avoid overloading gate Y.

Figure 5:
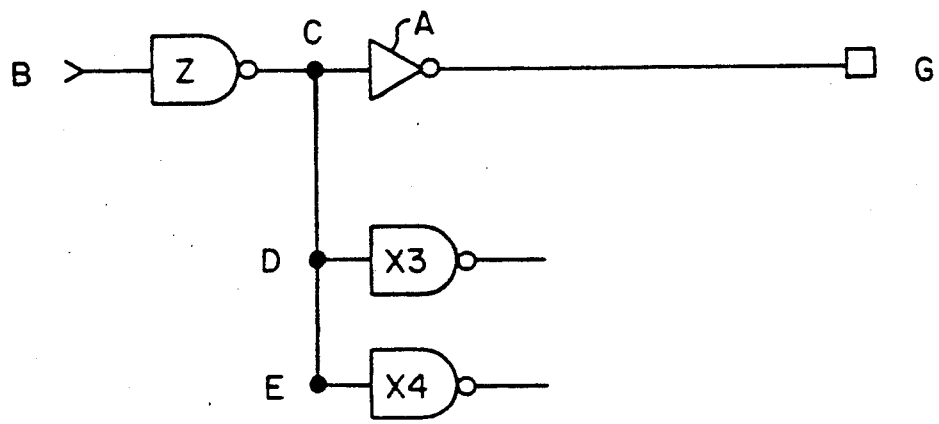
FIG. 5 is a logic diagram showing translation between ISL and TTL circuitry according to the invention.

The two ISL gates X1 and X2 shown in FIG. 4 can be eliminated by incorporating within the ISL gate Y the PNP translation transistor Q2 of FIGS. 1 through 3. The translation transistor Q2 provides the same buffering effect as the two gates X1 and X2. This improved circuit is illustrated in FIG. 5 where the ISL gate Y of FIG. 3 is replaced by ISL gate Z which incorporates the PNP translation transistor Q2. The ISL gate output at terminal C is applied directly to the TTL gate A without any intervening gates.

Figure 6:
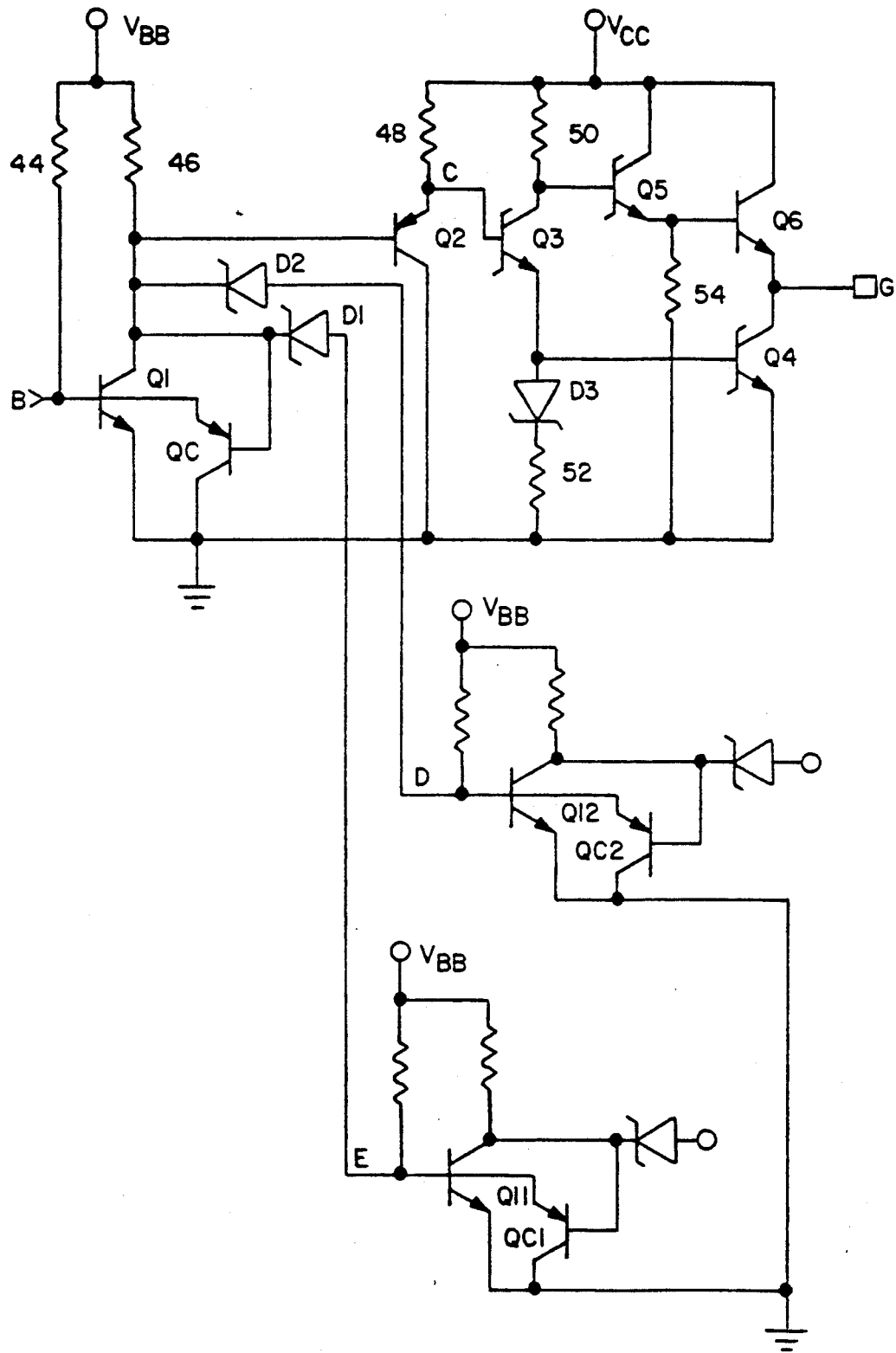
FIG. 6 is a schematic circuit representation of the logic diagram of FIG. 5.

Referring now to FIG. 6, there is shown a detailed schematic diagram of the improved logic shown in FIG. 5. An input signal at terminal B is coupled to the base input of the ISL gate comprising transistor Q1 shunted by the PNP clamping transistor QC. A current source includes a resistor 44 connected between the base of the transistor Q1 and a source of positive DC potential $V_{BB}$, such as 1.50 volts, and a resistor 46 connected between the collector of transistor Q1 and the $V_{BB}$ supply. The emitter of transistor Q1 and the collector of the clamping transistor QC are returned to common reference potential, or ground. The Schottky output diode D1 has its cathode connected to the collector of the transistor Q1 and its anode coupled to the input of another ISL gate similar to the first one and comprising NPN transistor Q11 and PNP clamping transistor QC1. Similarly, the second output diode D2 is coupled to a third ISL gate comprising NPN transistor Q11 and PNP clamping transistor QC2.

The collector of the NPN transistor Q1 has a third output coupled to the base of the PNP translation transistor Q2. The emitter of transistor Q2 is connected through a resistor 48 to a positive supply $V_{CC}$, such as 5 volts, and is also connected to the base of a Schottky clamped NPN transistor Q3. The collector of transistor 22 is returned to ground. The collector of the transistor Q3 is coupled through a resistor 50 to positive supply $V_{CC}$ and to the base of a Schottky clamped transistor Q5. The emitter of transistor Q3 is connected to the anode of a Schottky diode D3 and to the base of a Schottky clamped NPN output transistor Q4. A resistor 52 is connected between the cathode of the diode D3 and ground.

The emitter of transistor Q5 is connected through a resistor 54 to ground and is also connected to the base of an NPN transistor Q6. The collectors of transistors Q5 and Q6 are connected to positive supply $V_{CC}$. The emitter of transistor Q6 and the collector of transistor Q4 are connected together to an output terminal G. The emitter of output transistor Q4 is connected to ground.

In the operation of the circuit of FIG. 6, a HIGH logic input signal at terminal B will produce a LOW logic signal on the collector of transistor Q1. The LOW signal on the cathodes of diodes D1 and D2 causes their anodes to conduct LOW signals to the two ISL gates comprising transistors Q11 and Q12 respectively. The same LOW logic signal on the collector of transistor Q1 is coupled to translation transistor Q2, which is an emitter follower and conducts the LOW logic signal to its emitter at terminal C. The TTL circuit comprising transistors Q3, Q4, Q5, and Q6 functions as an inverter so that when a LOW signal is applied to the base of input transistor Q3, transistor Q3 turns OFF, transistor Q4 turns OFF, transistor Q5 turns ON, transistor Q6 turns ON, and the signal at output terminal G is HIGH.

Conversely, when a LOW logic signal is applied to the input terminal B of the ISL gate, transistor Q1 turns OFF, placing a HIGH signal on the base of transistor Q2. Transistor Q2 goes OFF and terminal C goes HIGH. A HIGH signal on the base of TTL input transistor Q3 causes the latter to turn on, causing transistor Q4 to turn ON and transistor Q5 to turn OFF. This forces transistor Q6 to turn off, causing the signal on output terminal G to go LOW.

When transistors Q3 and Q4 turn on, they clamp the Q2 emitter voltage at a value near $2V_{BE}$, where $V_{BE}$ is the magnitude of the voltage across the base-emitter junction of a bipolar transistor when it just turns on. Since $V_{BB}$ is about $2V_{BE}$ in the present example whereas $V_{CC}$ is considerably higher, this clamping action is what enables transistor Q2 to turn off when transistor Q1 turns off. If the clamp were not present, the Q2 emitter voltage would approach $V_{CC}$ as the Q2 base goes high. Transistor Q2 would remain on, permitting current from the $V_{CC}$ supply to flow though resistor 46 to the $V_{BB}$ supply.

The advantages of employing a single translation transistor Q2 between the first ISL gate and the TTL circuit are readily apparent. The PNP transistor Q2 may be incorporated in the same isolation island with the ISL transistor Q1, thereby conserving space. Furthermore, the PNP translation transistor Q2 replaces two additional ISL gates thereby further reducing space and also shortening the time delay.

Figure 7:
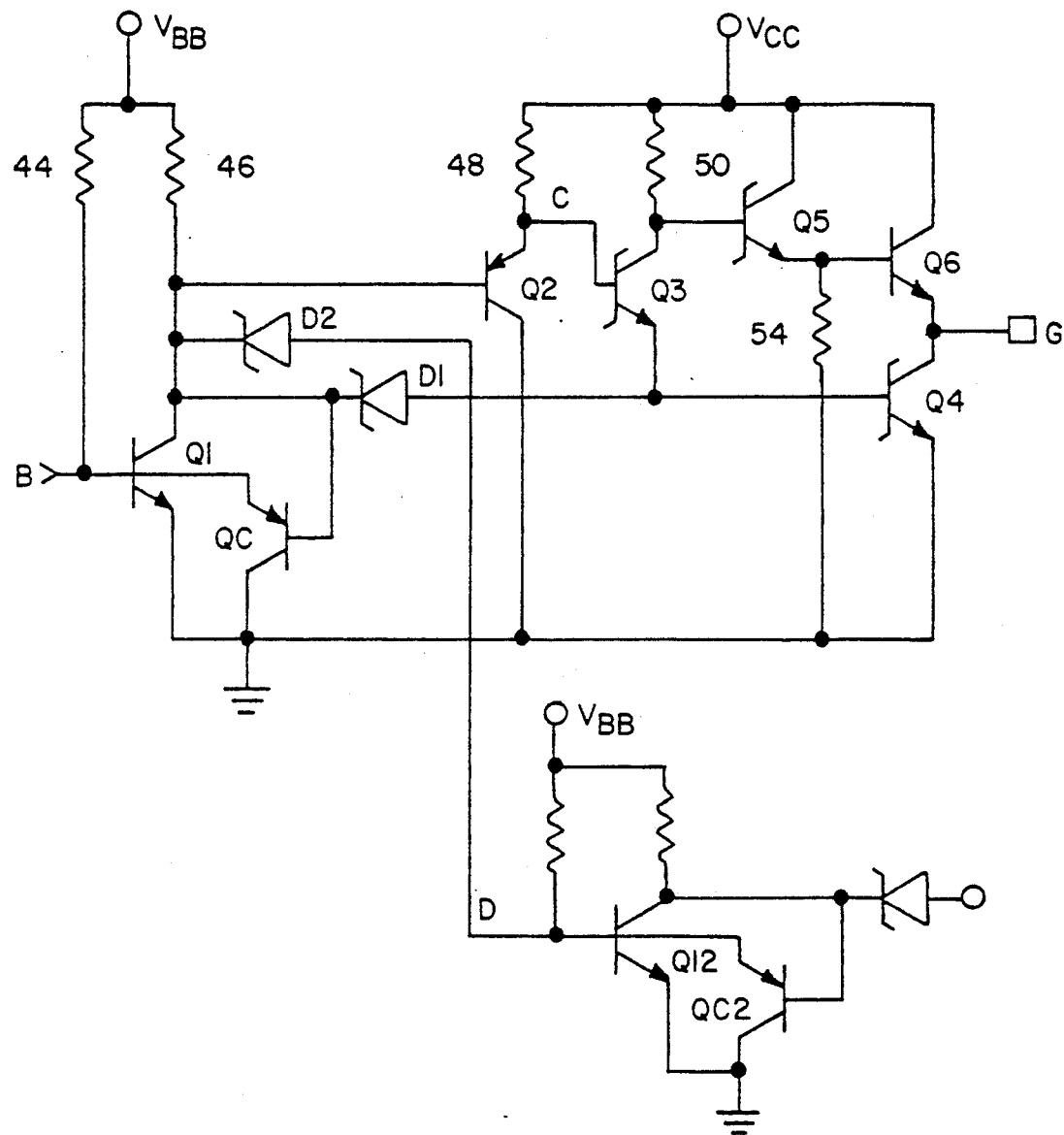
FIG. 7 is a schematic circuit showing a modification of FIG. 6 in which an ISL Schottky diode is used as an active pulldown for one of the output TTL transistors.

A further improvement may be effected by utilizing one of the Schottky diodes of the ISL circuit to perform a pulldown function for the output transistor Q4 of the TTL circuit. This improvement is illustrated in FIG. 7, wherein the Schottky diode D3 and resistor 52 are eliminated from the base circuit of output transistor Q4. Instead, one of the Schottky diodes, such as D1, present in the collector region of the ISL transistor Q1, has its anode connected directly to the base of output transistor Q4 in common with the emitter of transistor Q3. As a result, when a HIGH logic signal is applied to input terminal B turning transistor Q1 ON, diode D1 is also turned ON, placing the base of output transistor Q4 at a voltage above ground equal only to the internal voltage drop of transistor Q1 plus the forward voltage drop of diode D1, both of which are very small. The low voltage applied to the base of transistor Q4 holds it OFF.

The active pull down formed by transistor Q1 and diode D1 holds the base of the output transistor Q4 OFF through the low forward resistance of Schottky diode D1. A true collector-base breakdown is seen at point G, instead of a collector emitter breakdown when a transistor or resistor is used as a pull down Another advantage is that when transistor Q4 is turned ON diode D1 is reversed biased and the entire emitter current of transistor Q3 goes to transistor Q4 instead of splitting between transistor Q4 and diode D3, as it would in the circuit of FIG. 6. The active pull down afforded by diode D1 and transistor Q1 provides yet another advantage in assuring that transistor Q4 turns off before transistors Q5 and Q6 turn on, thereby eliminating current spikes that would occur if transistors Q5 and Q6 and Q4 were on at the same time.

What is claimed is:

1. An integrated circuit in which:
   n-type semiconductive islands adjoin a common underlying p-type semiconductive substrate region;
   isolation means laterally surrounds each island to horizontally electrically isolate it from the other islands at least during operation of the circuit;
   a first transistor has a P base located within one of the islands along its upper surface for receiving a signal input, an N emitter located within the P base along the upper surface spaced apart from material of the island outside the P base, and an N collector adjoining the P base below it; and
   an n-type zone located within the island along the upper surface and coupled through an n-type path to the N collector adjoins an overlying electrical conductor to form a Schottky diode; characterized by:
   a second transistor having a P emitter located within the island along the upper surface spaced apart from the P base, an N base adjoining the P emitter below it and coupled through an n-type path to the N collector, and a P collector comprising the substrate region;
   a third transistor having an N emitter, a P base connected to the emitter of the second transistor, and an N collector;
   a fourth transistor having an N emitter, a P base connected to the emitter of the third transistor and to the conductor, and an N collector;
   a fifth transistor having an N emitter, a P base coupled to the collector of the third transistor, and an N collector; and
   a sixth transistor having an N emitter coupled to the collector of the fourth transistor for providing a signal output, a P base coupled to the emitter of the fifth transistor, and an N collector.

2. An integrated circuit in which:
   semiconductive islands of a first conductivity type adjoin a common underlying semiconductive substrate region of a second conductivity type opposite to the first conductivity type;
   isolation means laterally surrounds each island to horizontally electrically isolate it from the other islands at least during operation of the circuit;
   a first transistor has (a) a first base of the second conductivity type located within one of the islands along its upper surface, (b) a fist emitter of the first conductivity type located within the first base along the upper surface spaced apart from material of the island outside the first base, and (c) a first collector of the first conductivity type adjoining and underlying the first base within the island; and
   a zone of the first conductivity type located within the island along its upper surface and coupled through a path of the first conductivity type to the first collector adjoins an overlying electrical conductor to form a circuit diode, the circuit portion formed by the island, the substrate region, and the conductor providing a signal output at the conductor in response to a signal input at the first base; characterized by:
   a second transistor having (a) a second emitter of the second conductivity type located within the island along its upper surface spaced apart from the first base, (b) a second base of the first conductivity type adjoining the second emitter below it and coupled through a path of the first conductivity type to the first collector, and (c) a second collector comprising the substrate region, the above-mentioned circuit portion providing another signal output at the second emitter in response to the signal output;
   a first resistor coupled between the first collector and a source of a first supply voltage;
   a second resistor coupled between the second emitter and a source of a second supply voltage; and
   means separate from the resistors for clamping the voltage at the second emitter at a value sufficiently close to the first supply voltage to enable the second transistor to turn off when the first transistor turns off.

3. An integrated circuit in which:
   n-type semiconductive islands adjoin a common underlying p-type semiconductive substrate region;
   isolation means laterally surrounds each island to horizontally electrically isolate it from the other islands at least during operation of the circuit;
   a first transistor has (a) a P base located within one of the islands along its upper surface, (b) an N emitter located within the P base along the upper surface spaced apart from material of the island outside the P base, and (c) an N collector adjoining the P base below it; and
   an n-type zone located within the island along the upper surface and coupled through an n-type path to the N collector adjoins an overlying electrical conductor to from a Schottky diode, the circuit portion formed by the island, the substrate region, and the conductor providing a signal output at the conductor in response to a signal input at the P base; characterized by:
   a second transistor having (a) a P emitter located within the island along the upper surface spaced apart from the P base, (b) an N base adjoining the P emitter below it and coupled through an p-type path to the N collector, and (c) a P collector comprising the substrate region, the above-mentioned circuit portion providing another signal output at the P emitter in response to the signal input;
   a first resistor coupled between the N collector and a source of a first supply voltage;
   a second resistor coupled between the P emitter and a source of a second supply voltage; and
   means separate from the resistors for clamping the voltage at the P emitter at a value sufficiently low to enable the second transistor to turn off when the first transistor turns off.

4. An integrated circuit in which:
   n-type semiconductive islands adjoin a common underlying p-type semiconductive substrate region;
   isolation means laterally surrounds each island to horizontally electrically isolate it from the other islands at least during operation of the circuit;
   a first transistor has (a) a P base located within one of the islands along its upper surface, (b) an N emitter located within the P base along the upper surface spaced apart from material of the island outside the P base, and (c) an N collector adjoining the P base blow it; and an n-type zone located within the island along the upper surface and coupled through an n-type path to the N collector adjoins an overlying electrical conductor to form a Schottky diode, the circuit portion formed by the island, the substrate region, and the conductor providing a signal output at the conductor in response to a signal input at the base of the first transistor; characterized by:

a second transistor having (a) a P emitter located within the island along the upper surface spaced apart from the P base, (b) an N base adjoining the P emitter below it and coupled through an n-type path to the N collector, and (c) a P collector comprising the substrate region, the above-mentioned circuit portion providing another signal output at the emitter of the second transistor in response to the signal input;

a third transistor having an N emitter, a P base connected to the emitter of the second transistor, and an N collector; and a fourth transistor having an N emitter, a P base connected to the emitter of the third transistor, and an N collector for providing a signal output, the Schottky diode being coupled through the conductor to the base of the fourth transistor.

* * * * *